(12) United States Patent
Furubayashi et al.

(10) Patent No.: US 9,703,912 B2
(45) Date of Patent: Jul. 11, 2017

(54) MASK SET, FABRICATION METHOD OF MASK SET, MANUFACTURING METHOD OF SEMICONDUCTOR DEVICE, AND RECORDING MEDIUM

(71) Applicant: Kabushiki Kaisha Toshiba, Minato-ku (JP)

(72) Inventors: Ai Furubayashi, Kasukabe (JP); Takashi Obara, Yokohama (JP); Takaki Hashimoto, Yokohama (JP); Nobuhiro Komine, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 106 days.

(21) Appl. No.: 14/747,295

(22) Filed: Jun. 23, 2015

(65) Prior Publication Data

US 2016/0266484 A1    Sep. 15, 2016

Related U.S. Application Data

(60) Provisional application No. 62/131,085, filed on Mar. 10, 2015.

(51) Int. Cl.
*G03F 1/42* (2012.01)
*G03F 1/84* (2012.01)
*G06F 17/50* (2006.01)
*G03F 7/20* (2006.01)
*G03F 7/32* (2006.01)
(Continued)

(52) U.S. Cl.
CPC ............ *G06F 17/5072* (2013.01); *G03F 1/38* (2013.01); *G03F 1/70* (2013.01); *G03F 1/84* (2013.01); *G03F 7/2022* (2013.01); *G03F 7/32* (2013.01); *G06F 17/5081* (2013.01)

(58) Field of Classification Search
CPC ...................................... G03F 1/42; G03F 1/84
See application file for complete search history.

(56) References Cited

U.S. PATENT DOCUMENTS

2002/0076623 A1    6/2002 Mori
2009/0246709 A1*  10/2009 Nakasugi ............... B82Y 10/00
                                                                430/319
(Continued)

FOREIGN PATENT DOCUMENTS

JP    2002-182368    6/2002
JP    2003-209049    7/2003
JP    2006-154597    6/2006
(Continued)

*Primary Examiner* — Stephen Rosasco
(74) *Attorney, Agent, or Firm* — Oblon, McClelland, Maier & Neustasdt, L.L.P.

(57) ABSTRACT

According to one embodiment, there is provided a mask set including a first mask and a second mask. The first mask includes a first device pattern and a first mark pattern. The first mark pattern is used for an inspection of a position of the first device pattern on a surface of the first mask. The second mask is used to perform multiple exposure on a substrate together with the first mask. The second mask includes a second device pattern and a second mark pattern. The second mark pattern is used for an inspection of a position of the second device pattern on a surface of the second mask. The second mark pattern includes a pattern corresponding to a pattern obtained by inverting the first mark pattern.

20 Claims, 9 Drawing Sheets (51) Int. Cl.
*G03F 1/38* (2012.01)
*G03F 1/70* (2012.01)

(56) References Cited

U.S. PATENT DOCUMENTS

2011/0273685 A1 11/2011 Li et al.
2012/0057159 A1 3/2012 Deckers et al.

FOREIGN PATENT DOCUMENTS

| JP | 2011-199282 | 10/2011 |
| JP | 2011-238919 | 11/2011 |

* cited by examiner

FIG.6A — FIRST EXPOSURE

FIG.6B — SECOND EXPOSURE

L/S INVERSION

FIG.6C — AFTER OVERLAY

MASK SET, FABRICATION METHOD OF MASK SET, MANUFACTURING METHOD OF SEMICONDUCTOR DEVICE, AND RECORDING MEDIUM

CROSS-REFERENCE TO RELATED APPLICATIONS

This application is based upon and claims the benefit of priority from U.S. Provisional Application No. 62/131,085, filed on Mar. 10, 2015 the entire contents of which are incorporated herein by reference.

FIELD

Embodiments described herein relate generally to a mask set, a fabrication method of a mask set, a manufacturing method of a semiconductor device, and a recording medium.

BACKGROUND

In multiple exposure, a substrate is subjected to exposure using a plurality of masks sequentially. At this time, it is desirable to increase an overlay accuracy between a plurality of masks.

DETAILED DESCRIPTION

In general, according to one embodiment, there is provided a mask set including a first mask and a second mask. The first mask includes a first device pattern and a first mark pattern. The first mark pattern is used for an inspection of a position of the first device pattern on a surface of the first mask. The second mask is used to perform multiple exposure on a substrate together with the first mask. The second mask includes a second device pattern and a second mark pattern. The second mark pattern is used for an inspection of a position of the second device pattern on a surface of the second mask. The second mark pattern includes a pattern corresponding to a pattern obtained by inverting the first mark pattern.

Exemplary embodiments of a mask set will be explained below in detail with reference to the accompanying drawings. The present invention is not limited to the following embodiments.

Embodiments

For example, a mask set, a fabrication method of a mask set, a manufacturing method of a semiconductor device, and a recording medium according to an embodiment are used in a lithography process in a process of manufacturing a semiconductor device. For example, when a via pattern has to be formed on a certain processed layer, a fine resist pattern can be provided by performing multiple exposure, where exposure is performed using a plurality of masks sequentially on a substrate coated with a resist. When data of a mask set including a plurality of masks is generated, a mask data generating program read from a recording medium is executed by a computer (see FIG. 1), and data of each mask is fabricated based on design layout data. Each mask is fabricated using the generated data of each mask.

Figure 7:
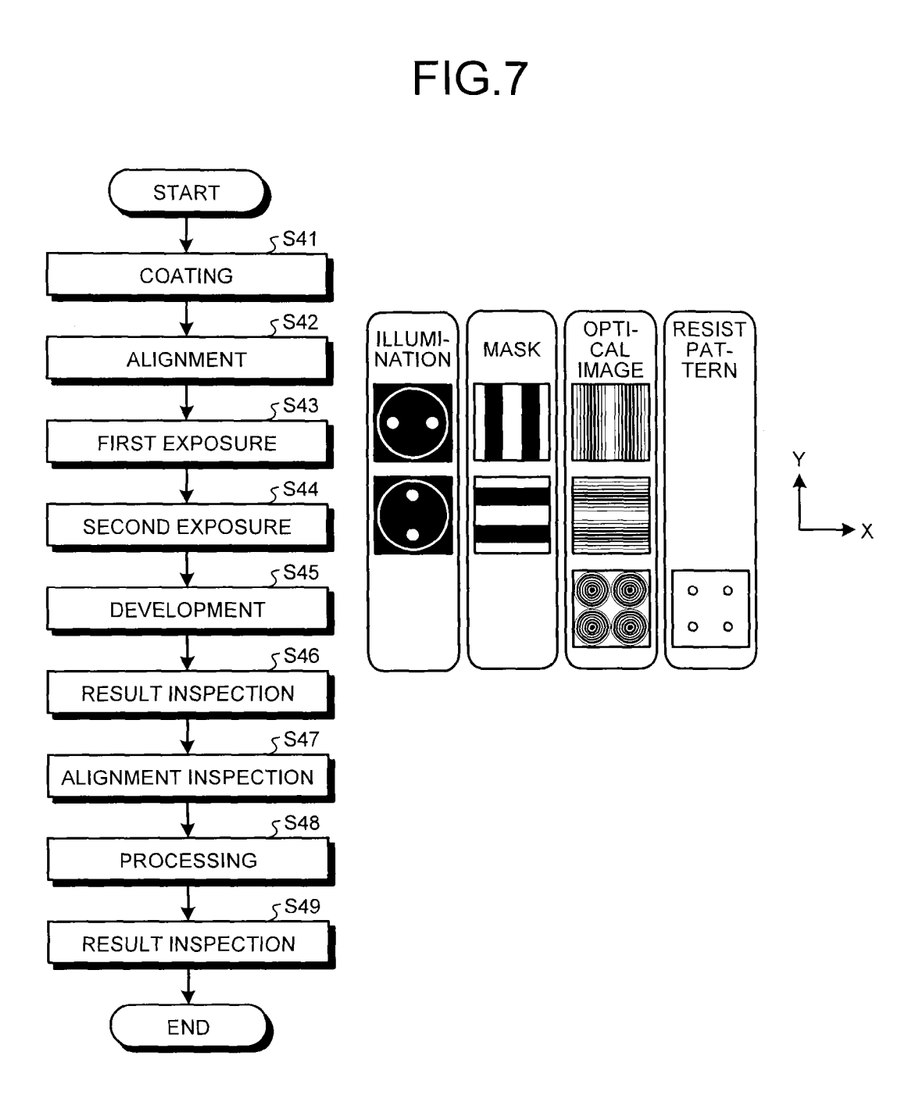
FIG. 7 is a flowchart illustrating a manufacturing method of a semiconductor device according to an embodiment.

In the multiple exposure, for example, an illumination optical system 214 of an exposure apparatus 201 (see FIG. 11) has a lighting shape in which n poles (n is an integer of 2 or larger, and for example, n=2) are provided in each of first exposure and second exposure, and n poles have rotational symmetry of 2×n times (see FIG. 7). Accordingly, a device pattern formed on a mask for the first exposure and a device pattern formed on a mask for the second exposure have rotational symmetry of 2×n times. Thus, it is possible to form a fine resist pattern (a developing pattern of a resist) by interference between a latent image formed on a resist by the first exposure and a latent image formed on a resist by the second exposure (see FIG. 7).

In the multiple exposure, in order to form a fine resist pattern, a high overlay accuracy between a plurality of masks is required. In order to improve the overlay accuracy, a positional accuracy of a device pattern on a mask surface of each mask is required when a plurality of masks are generated. To this end, in each mask, a mark pattern used to inspect a device pattern forming position is formed on a mask surface. Since the mark pattern is a pattern unnecessary for a semiconductor device and not desired to be transferred onto a device pattern forming region on a substrate, the mark pattern is formed in a kerf region on the periphery of the device pattern forming region. This is likely to increase a distance from a mark pattern to a device pattern in each mask. When the distance from the mark pattern to the device pattern is increased, the accuracy of inspecting the device pattern forming position on the mask surface using the mark pattern is easily lowered, and thus the overlay accuracy between a plurality of masks is easily lowered.

Further, when the mark pattern is formed at a position close to the device pattern with a dimension less than a resolution limit in order to decrease the distance from the mark pattern to the device pattern, the dimension of the mark pattern on the mask surface is likely to be decreased. For example, the device pattern and the mark pattern are formed by depositing a light shielding film made of Cr or the like on a glass substrate. When the dimension of the mark pattern on the mask surface is small, the mask is likely to be defective, for example, because the mark pattern is easily peeled off from the mask surface (the surface of the glass substrate) and the peeled mark pattern is attached to the device pattern.

In this regard, in the present embodiment, latent images, in which the mark pattern on the mask for the first exposure and the mark pattern on the mask for the second exposure are inverted to each other, are formed on the resist. Thereby, the mark pattern is formed on the mask surface at a position near the device pattern with a dimension equal to or larger than the resolution limit, but the mark pattern is not transferred onto the substrate.

Further, the following description will proceed with an example of a bright field mask in which a device pattern is formed on a mask whose entire surface is a bright portion by a resist residue (dark portion). However, the same applies to a dark field mask in which a device pattern is formed on a mask whose entire surface is a dark portion by resist removal (a bright portion).

Figure 1:
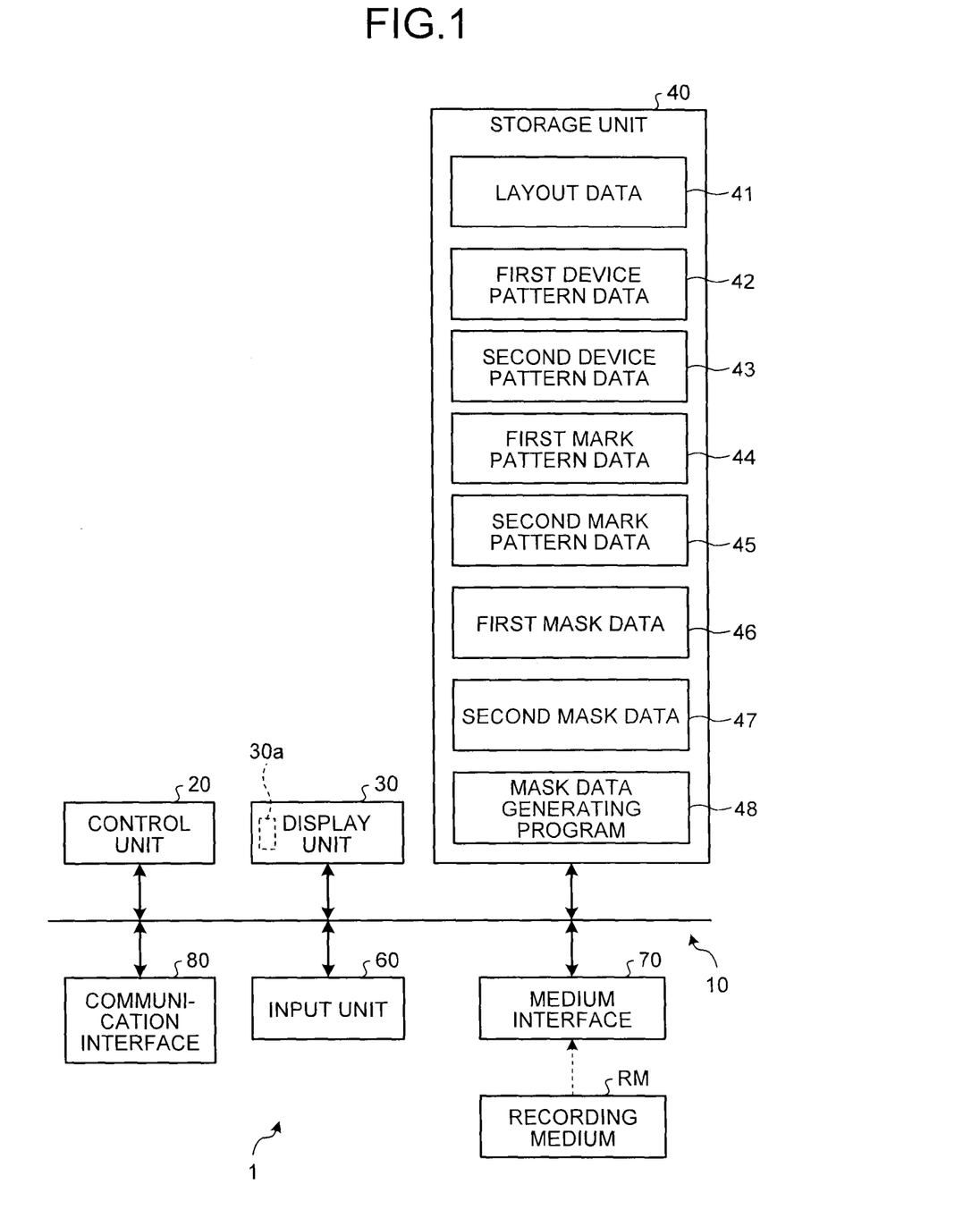
FIG. 1 is a diagram illustrating a configuration of a computer that executes a mask data generating program according to an embodiment.

Specifically, a mask data generating program is executed by a computer 1 illustrated in FIG. 1. FIG. 1 is a diagram illustrating a configuration of the computer 1 that executes the mask data generating program.

The computer 1 includes a bus line 10, a control unit 20, a display unit 30, a storage unit 40, an input unit 60, a medium interface 70, and a communication interface 80.

The control unit 20, the display unit 30, the storage unit 40, the input unit 60, the medium interface 70, and the communication interface 80 are connected to one another via the bus line 10. The medium interface 70 is configured to be connectable to a recording medium RM. The communication interface 80 can receive information from the outside via a wired communication line or a wireless communication line.

The storage unit 40 stores layout data 41, first device pattern data 42, second device pattern data 43, first mark pattern data 44, second mark pattern data 45, first mask data 46, second mask data 47, and a mask data generating program 48.

The layout data 41 is data which is obtained by a layout design in a design of an integrated circuit. The layout data 41 includes data of a plurality of device patterns.

The first device pattern data 42 includes data of a plurality of first device patterns generated for the first exposure so that a plurality of device patterns included in the layout data 41 are obtained in the multiple exposure. Each of the first device patterns is a device pattern formed on a first mask MK-1. The first mask MK-1 is a mask for the first exposure.

The second device pattern data 43 includes data of a plurality of second device patterns generated for the second exposure so that a plurality of device patterns included in the layout data 41 are obtained in the multiple exposure. Each of the second device patterns is a device pattern formed on a second mask MK-2. The second mask MK-2 is a mask for the second exposure.

The first mark pattern data 44 is data of the mark pattern formed on the first mask MK-1 to inspect a first device pattern forming position on the mask surface of the first mask MK-1.

The second mark pattern data 45 is data of the mark pattern formed on the second mask MK-2 to inspect a second device pattern forming position on the mask surface of the second mask MK-2.

Figure 11:
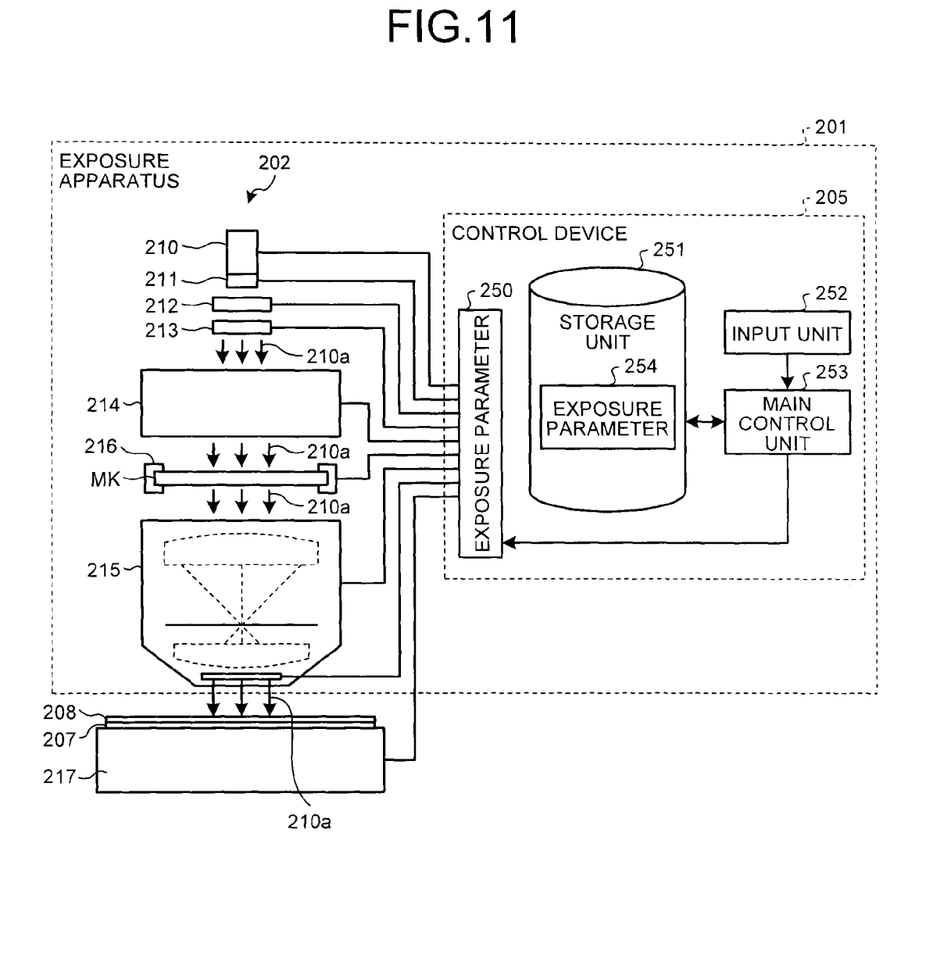
FIG. 11 is a diagram illustrating a configuration of an exposure apparatus that performs an exposure process using a mask fabricated by a fabrication method of a mask set according to an embodiment.

The first mask data 46 is data for rendering a pattern on the first mask MK-1 (see a mask MK of FIG. 11). The second mask data 47 is data for rendering a pattern on the second mask MK-2 (see the mask MK of FIG. 11). The mask data generating program 48 is a program for generating the first mask data 46 and the second mask data 47, that is, data of a mask set including the first mask MK-1 and the second mask MK-2. Each of the masks MK is used to form a latent image on the resist on a substrate through a projection optical system 215 to which illumination light is radiated by an illumination optical system 214 of the exposure apparatus 201 (see FIG. 11).

The control unit 20 is, for example, a CPU, a GPU, a DSP, a micro controller, or the like, and further includes a cache memory for temporary storage. The display unit 30 is a display device such as a CRT display or a liquid crystal display (LCD), and includes a screen 30a. The storage unit 40 is, for example, a memory, a hard disk, or the like. The input unit 60 is, for example, a keyboard, a mouse, or the like. The medium interface 70 is, for example, a flexible disk drive, a CD-ROM drive, a USB interface, or the like. The recording medium RM is a flexible disk, a CD-ROM, a USB memory, or the like. The communication interface 80 is an interface configured according to a wired communication or wireless communication standard.

Figure 2:
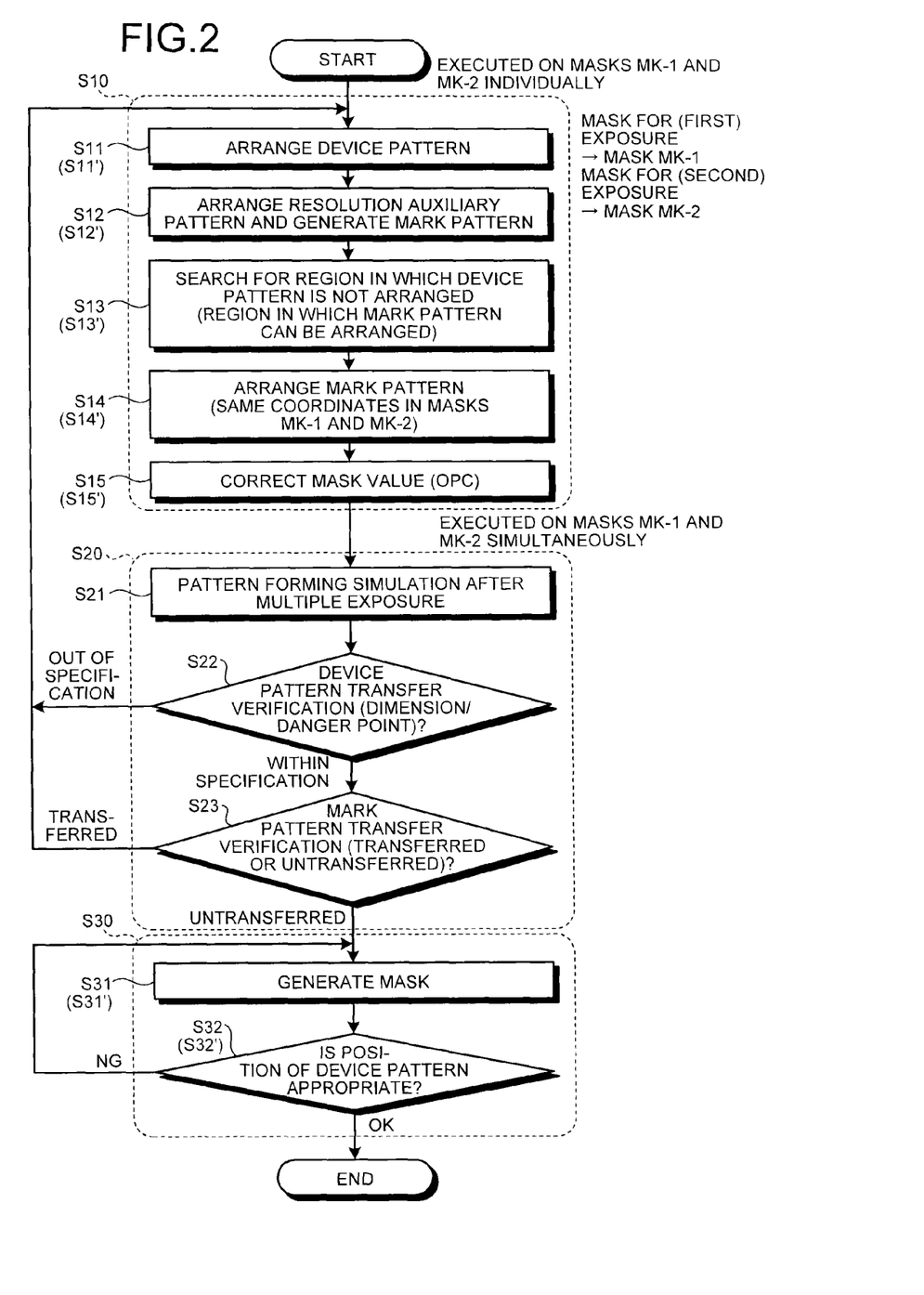
FIG. 2 is a flowchart illustrating a fabrication method of a mask set according to an embodiment.

Next, a method of forming a mask set including the first mask MK-1 and the second mask MK-2 will be described with reference to FIG. 2. FIG. 2 is a flowchart illustrating a fabrication method of a mask set.

The control unit 20 generates data of a plurality of first device patterns for the first exposure and data of a plurality of second device patterns for the second exposure from data of a plurality of device patterns included in the layout data 41 according to a certain pattern generating program. For example, when the device patterns included in the layout data 41 are via patterns, each of the first device patterns is generated as a line pattern extending in a Y direction, and each of the second device patterns is generated as a line pattern extending in an X direction (see FIG. 7). The control unit 20 stores the generated first device pattern data 42 and the second device pattern data 43 in the storage unit 40.

Then, the control unit 20 generates data of the mask set including the first mask MK-1 and the second mask MK-2 according to the mask data generating program 48 (S10). The control unit 20 generates data of the first mask MK-1 and data of the second mask MK-2 individually.

For example, the control unit 20 generates the data of the first mask MK-1 as follows.

Figure 3A:
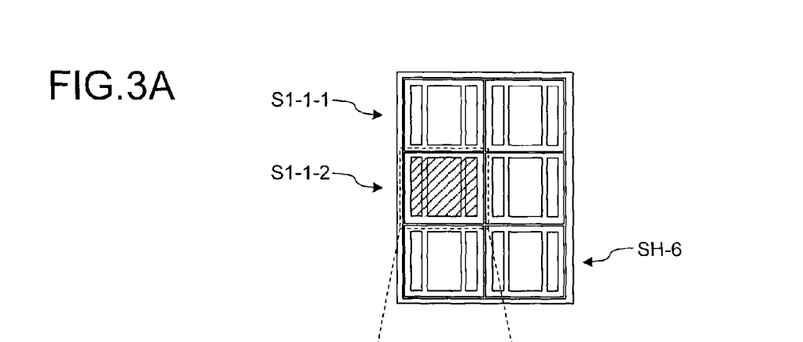
FIGS. 3A to 3C are plane views illustrating a configuration of a mask in a mask set according to an embodiment.
Figure 3B:
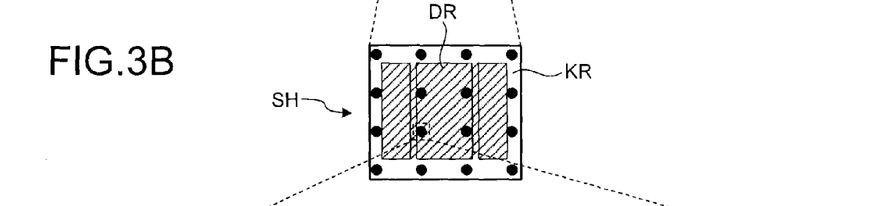
Figure 3C:
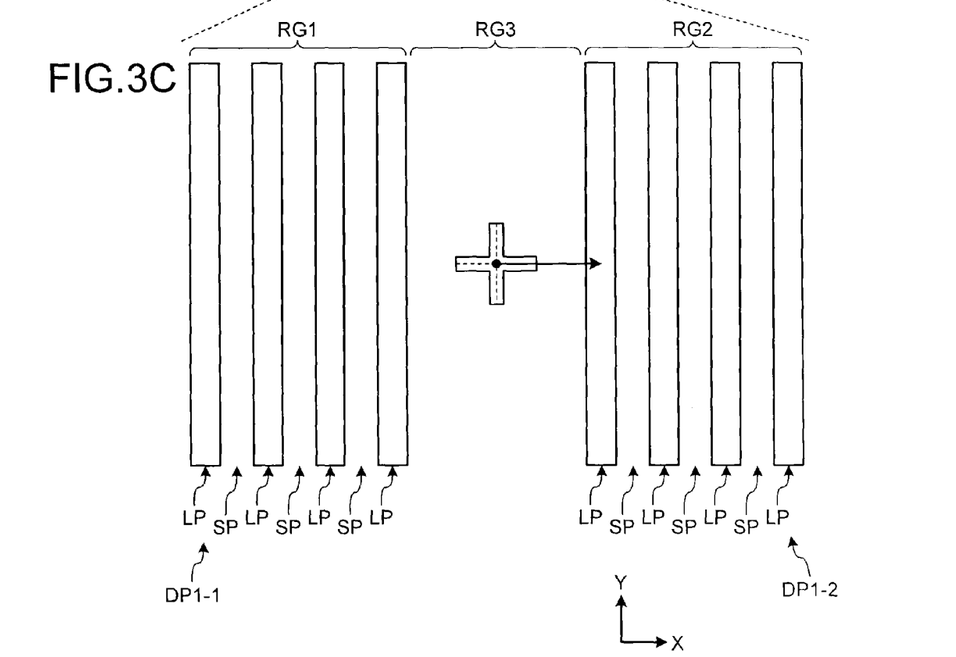

The control unit 20 sets a plurality of shot regions SH-1 to SH-6 on the mask surface as illustrated in FIG. 3A. FIGS. 3A to 3C are plane views illustrating a configuration of a mask. The control unit 20 reads the first device pattern data 42 from the storage unit 40. The control unit 20 arranges a plurality of first device patterns in a device region DR in each of the shot regions SH according to the first device pattern data 42, as indicated by hatching in FIG. 3B (S11). In a first device pattern DP1-1, a line pattern LP and a space pattern SP are arranged alternately and repeatedly as illustrated in FIG. 3C. The line pattern LP and the space pattern SP extend in the Y direction. Similarly, in a first device pattern DP1-2, the line pattern LP and the space pattern SP are arranged alternately and repeatedly as illustrated in FIG. 3C.

Figure 4A:
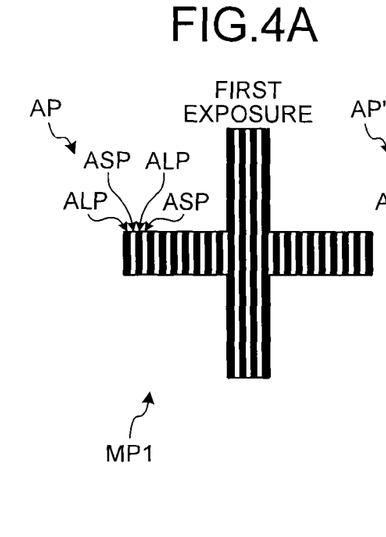
FIGS. 4A and 4B are plane views illustrating a configuration of a mark pattern according to an embodiment.
Figure 4B:
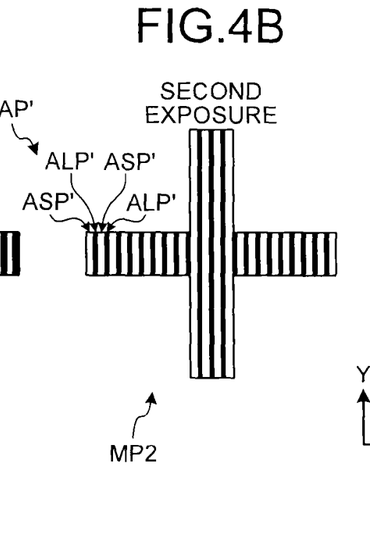
Figure 5A:
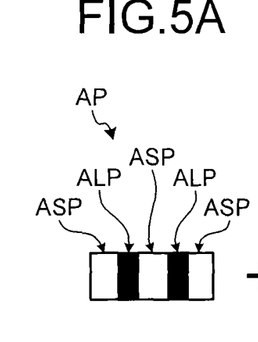
FIGS. 5A to 5C are enlarged plane views illustrating a configuration of a mark pattern according to an embodiment.
Figure 5B:
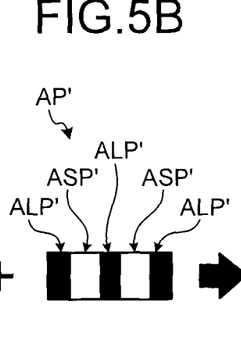
Figure 5C:
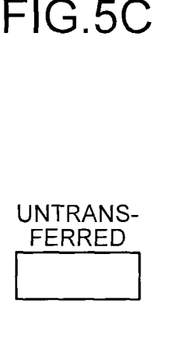

The control unit 20 sets an outer contour of a first mark pattern MP1 on a certain working space as illustrated in FIG. 4A. FIGS. 4A and 4B are plane views illustrating a configuration of the mark pattern. The outer contour of the first mark pattern MP1 has substantially a cross shape extending in the X direction and the Y direction. The control unit 20 arranges a resolvable auxiliary pattern AP in the outer contour of the first mark pattern MP1. The resolvable auxiliary pattern AP is an auxiliary pattern having a dimension equal to or larger than the resolution. In the resolvable auxiliary pattern AP, a line pattern ALP and a space pattern ASP are arranged alternately and repeatedly as illustrated in FIGS. 4A and 5A. For example, the line pattern ALP and the space pattern ASP extend in the Y direction. Each of the line pattern ALP and the space pattern ASP has a width of the resolution limit or higher, for example, as illustrated in FIG. 5A. FIGS. 5A to 5C are enlarged plane views illustrating a configuration of the mark pattern. Accordingly, the control unit 20 generates the first mark pattern data 44 to be arranged in each of the shot regions SH, and stores the generated first mark pattern data 44 in the storage unit 40 (S12).

The control unit 20 searches for a region in which the first device pattern DP1 is not arranged in each of the shot regions SH based on the data obtained in S11 (S13). The control unit 20 specifies a kerf region KR in each of the shot regions SH as a region in which the first device pattern DP1 is not arranged. The kerf region KR is a region surrounding the device region DR in the shot region SH. Further, the control unit 20 specifies a non-arranged region in which the first device pattern DP1 is not arranged in the device region DR. The control unit 20 specifies a non-arranged region RG3, in which the first device pattern DP1 is not arranged between a region RG1 where the first device pattern DP1-1 is arranged and a region RG2 where the first device pattern DP1-1 is arranged, for example, as illustrated in FIG. 3C.

The control unit 20 reads the first mark pattern data 44 from the storage unit 40. The control unit 20 repeatedly arranges the first mark pattern MP1 generated in S12 in the kerf region KR and the non-arranged region RG3 in the device region DR, according to the first mark pattern data 44 (S14). The control unit 20 arranges a plurality of first mark patterns MP1 in each of the shot regions SH at equal intervals, for example, as illustrated in FIG. 3B.

The control unit 20 performs optical proximity correction (OPC) on the first device pattern DP1 based on the data obtained in S14, and corrects a mask value (for example, a shape or a dimension of the first device pattern DP1) (S15). As a result, the control unit 20 generates the data 46 of the first mask MK-1, and stores the generated data 46 in the storage unit 40.

Further, for example, the control unit 20 generates the data of the second mask MK-2 as follows.

The control unit 20 sets a plurality of shot regions SH-1 to SH-6 on the mask surface as illustrated in FIG. 3A. The control unit 20 reads the second device pattern data 43 from the storage unit 40. The control unit 20 arranges a plurality of second device patterns in the device region DR in each of the shot regions SH according to the second device pattern data 43 as indicated by hatching in FIG. 3B (S11'). In a second device pattern DP1-2, a line pattern LP' and a space pattern SP' are arranged alternately and repeatedly (see FIG. 3C). The line pattern LP' and the space pattern SP' extend in the X direction. Similarly, in a second device pattern DP1-2, the line pattern LP' and the space pattern SP' are arranged alternately and repeatedly (see FIG. 3C).

The control unit 20 sets an outer contour of a second mark pattern MP2 on a certain working space as illustrated in FIG. 4B. The outer contour of the second mark pattern MP2 has substantially a cross shape extending in the X direction and the Y direction. The outer contour of the second mark pattern MP2 is equivalent to the outer contour of the first mark pattern MP1. The control unit 20 arranges a resolvable auxiliary pattern AP' in the outer contour of the second mark pattern MP2. The resolvable auxiliary pattern AP' is an auxiliary pattern having a dimension equal to or larger than the resolution limit. In the resolvable auxiliary pattern AP', a line pattern ALP' and a space pattern ASP' are arranged alternately and repeatedly as illustrated in FIG. 4B. The line pattern ALP' and the space pattern ASP' extend, for example, in the Y direction. Each of the line pattern ALP' and the space pattern ASP' has a width of the resolution limit or higher, for example, as illustrated in FIG. 5B.

The resolvable auxiliary pattern AP' in the second mark pattern MP2 is a pattern corresponding to a pattern obtained by inverting the resolvable auxiliary pattern AP in the first mark pattern MP1.

If the resolvable auxiliary pattern AP' is simply a pattern obtained by inverting the resolvable auxiliary pattern AP, latent images formed on the resist are likely to deviate from a mutually inverted relation due to dimension deviation or misalignment of patterns. Thus, since an exposure amount of the resist becomes non-uniform after the multiple exposure and, accordingly, a film thickness of the resist is likely to be non-uniform, it may affect processing of the substrate after development. Further, if the latent image by the resolvable auxiliary pattern AP and the latent image by the resolvable auxiliary pattern AP' significantly deviate from the mutually inverted relation, the pattern may be transferred onto the substrate after the multiple exposure.

In the present embodiment, the resolvable auxiliary pattern AP' is a pattern obtained by interchanging the line pattern with the space pattern in the resolvable auxiliary pattern AP and, in the obtained pattern, getting the line pattern thinner and the space pattern thicker, as illustrated in FIG. 5B. In other words, the resolvable auxiliary pattern AP' is formed such that the light shielding portion of the second mark pattern MP2 has a dimension smaller than the light transmitting portion of the first mark pattern MP1, and the light transmitting portion of the second mark pattern MP2 has a dimension larger than the light shielding portion of the first mark pattern MP1. Thus, the latent image by the resolvable auxiliary pattern AP and the latent image by the resolvable auxiliary pattern AP' are allowed to have a mutually inverted relation, and the exposure amount of the resist after the multiple exposure can be uniform (see FIG. 6C).

As a result, the control unit 20 generates the second mark pattern data 45 to be arranged in each of the shot regions SH, and stores the generated second mark pattern data 45 in the storage unit 40 (S12').

The control unit 20 searches for a region in which the second device pattern DP2 is not arranged in each of the shot regions SH based on the data obtained in S11' (S13'). The control unit 20 specifies the kerf region KR in each of the shot regions SH as the region in which the second device pattern DP2 is not arranged. The kerf region KR is a region surrounding the device region DR in the shot region SH. Further, the control unit 20 specifies a non-arranged region in which the second device pattern DP2 is not arranged in the device region DR. The control unit 20 specifies a non-arranged region RG3 in which the second device pattern DP2 is not arranged between a region RG2 in which the second device pattern DP1-2 is arranged and a region RG2 in which the second device pattern DP1-2 is arranged (see FIG. 3C).

The control unit 20 reads the second mark pattern data 45 from the storage unit 40. The control unit 20 repeatedly arranges the second mark pattern MP2 generated in S12' in the kerf region KR and the non-arranged region RG3 in the device region DR according to the second mark pattern data 45 (S14'). The control unit 20 arranges a plurality of second mark patterns MP2 in each of the shot regions SH at certain intervals (for example, at equal intervals) (see FIG. 3B).

It should be noted that the control unit 20 may arrange a plurality of second mark patterns MP2 at least partially in each of the shot regions SH at irregular intervals (for example, at mutually irregular intervals).

At this time, the control unit 20 arranges each of the second mark patterns MP2 so that an arrangement position of each second mark pattern MP2 on the mask surface is identical to (has the same coordinates as) an arrangement position of each first mark pattern MP1 on the mask surface.

The control unit 20 performs optical proximity correction (OPC) on the first device pattern DP1 based on the data obtained in S14', and corrects a mask value (for example, a shape or a dimension of the second device pattern DP2) (S15'). As a result, the control unit 20 generates the data 47 of the second mask MK-2, and stores the generate data 47 in the storage unit 40.

When the data of the first mask MK-1 and the data of the second mask MK-2 are fabricated, the control unit 20 evaluates whether or not the data of the first mask MK-1 and the data of the second mask MK-2 are appropriate according to a certain evaluation program (S20).

Specifically, the control unit 20 reads the first mask data 46 and the second mask data 47 from the storage unit 40. The control unit 20 obtains a pattern to be formed on the substrate after the multiple exposure by a simulation based on the first mask data 46 and the second mask data 47 (S21). In other words, the control unit 20 obtains an exposure amount distribution in the resist when, on the substrate coated with the resist, the first exposure is performed using the first mask MK-1 according to the first mask data 46 and the second exposure is performed using the second mask MK-2 according to the second mask data 46. Then, the control unit 20 obtains a region in which the exposure amount exceeds a slice level (see FIG. 6C), and specifies the obtained region as a pattern. The slice level is experimentally decided in advance as an exposure amount of a lower limit in which the pattern is transferred onto the resist.

It should be noted that, depending on a process, the slice level may be experimentally decided in advance as an exposure amount of an upper limit in which the pattern is transferred onto the resist. At this time, the control unit 20 obtains a region in which the exposure amount is less than the slice level (see FIG. 6C), and specifies the obtained region as a pattern.

The control unit 20 verifies whether or not the device pattern transferred onto the resist satisfies specification requirements based on the pattern obtained in S21 (S22). For example, the control unit 20 verifies whether or not a dimension of the transferred device pattern falls within an allowable range. The control unit 20 verifies whether or not a distance between the transferred device pattern and another pattern that should not come in contact with the transferred device pattern is a threshold value or larger. When the device pattern transferred onto the resist does not satisfy with the specification requirements ("out of specification" in S22), the control unit 20 determines that it is necessary to generate the mask set data again, and causes the process to return to S11 and S11'.

When the device pattern transferred onto the resist satisfies with the specification requirements ("within specification" in S22), the control unit 20 verifies that the first mark pattern MP1 and the second mark pattern MP2 are not to be transferred onto the substrate by the multiple exposure.

Figure 6A:
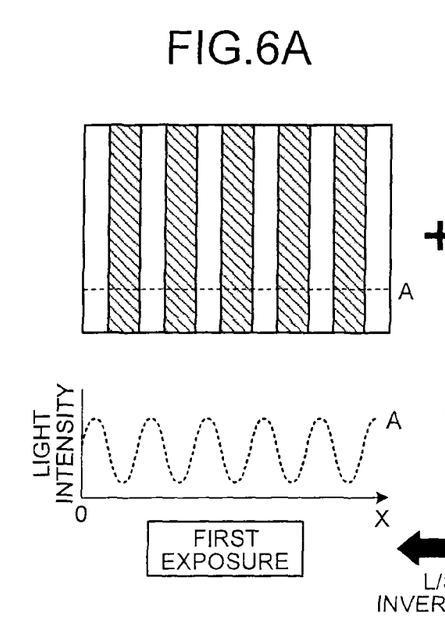
FIGS. 6A to 6C are diagrams illustrating a principle in which a mark pattern is not transferred according to an embodiment.
Figure 6B:
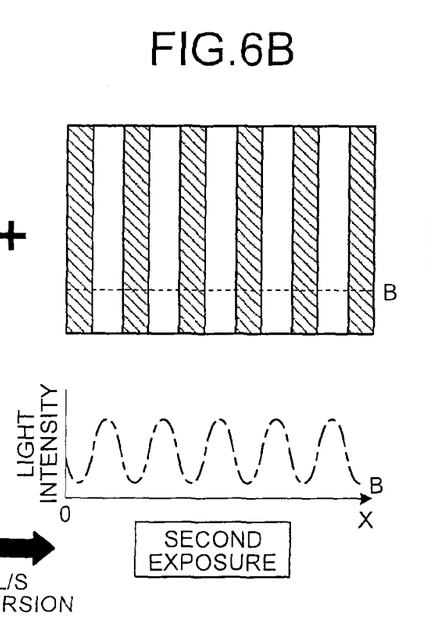
Figure 6C:
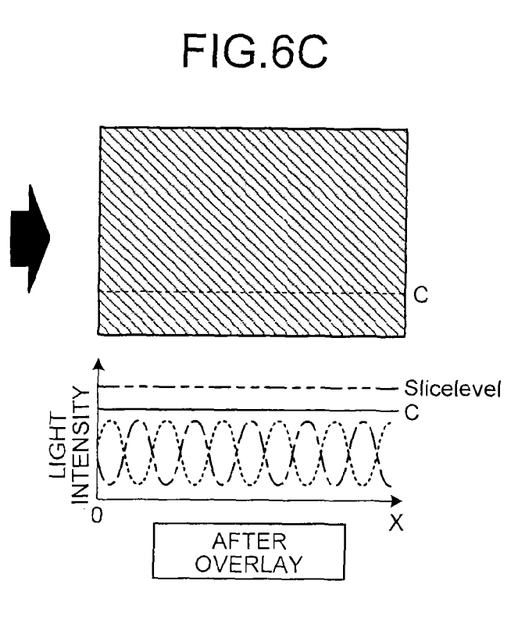

For example, as illustrated in FIGS. 6A and 6B, the auxiliary patterns in the first mark pattern MP1 and the second mark pattern MP2 have patterns corresponding to the mutually inverted patterns so that the inverted latent images are formed in the resist (see FIGS. 5A and 5B). As a result, when the first mark pattern MP1 and the second mark pattern MP2 are appropriately formed, the pattern has the exposure amount less than the slice level and, therefore, is not transferred at the arrangement position of the mark pattern in the resist after the multiple exposure, as illustrated in FIG. 6C (see FIG. 5C).

Referring back to FIG. 2, the control unit 20 verifies whether or not the pattern has been transferred to the positions at which the first mark pattern MP1 and the second mark pattern MP2 are arranged in S14 and S14' in the pattern obtained in S21. When the pattern has been transferred onto the arrangement positions of the first mark pattern MP1 and the second mark pattern MP2 ("transferred" in S23), the control unit 20 determines that it is necessary to generate the mask set data again, and causes the process to return to S11 and S11'.

When the pattern has not been transferred onto the arrangement positions of the first mark pattern MP1 and the second mark pattern MP2 ("untransferred" in S23), the control unit 20 determines that the data of the first mask MK-1 and the data of the second mask MK-2 are appropriate, and fabricates the mask set (S30).

For example, a mask fabricating apparatus (not illustrated) (e.g. an EB drawing device) acquires the first mask data 46. The mask fabricating apparatus forms a plurality of first device patterns DP1 and a plurality of first mark patterns MP1 on a glass substrate based on the first mask data 46, and fabricates the first mask MK-1 (S31). A mask inspecting device inspects a forming position of each first device pattern DP1 on the mask surface of the first mask MK-1 using the first mark pattern MP1 (S32).

For example, the mask inspecting device obtains a vector distance from the center of the first mark pattern MP1 to, for example, the center of the line pattern LP in the first device pattern DP1 as illustrated in FIG. 3C. The mask inspecting device specifies coordinates of the line pattern LP from the obtained vector distance, and inspects whether or not the specified coordinates fall within an allowable range.

When the forming position of each first device pattern DP1 exceeds the allowable range (NG in S32), it is determined that it is necessary to fabricate the mask again, and the process returns to S31. When the forming position of each first device pattern DP1 falls within the allowable range (OK in S32), the process ends.

Similarly, the mask fabricating apparatus acquires the second mask data 47. The mask fabricating apparatus forms a plurality of second device patterns DP2 and a plurality of second mark patterns MP2 on a glass substrate based on the second mask data 47, and fabricates the second mask MK-2 (S31'). The mask inspecting device inspects the forming position of each second device pattern DP2 on the mask surface of the second mask MK-2 using the second mark pattern MP2 (S32').

For example, the mask inspecting device obtains a vector distance from the center of the second mark pattern MP2 to, for example, the center of the line pattern LP in the first device pattern DP1 (see FIG. 3C). The mask inspecting device specifies coordinates of the line pattern LP from the obtained vector distance, and inspects whether or not the specified coordinates fall within an allowable range.

When the forming position of each second device pattern DP2 exceeds and deviates from the allowable range (NG in S32'), it is determined that it is necessary to fabricate the mask again, and the process returns to S31'. When the forming position of each first device pattern DP1 falls within the allowable range (OK in S32'), the process ends.

Next, a manufacturing method of a semiconductor device including a multiple exposure process using the fabricated mask set will be described with reference to FIG. 7. FIG. 7 is a flowchart illustrating a manufacturing method of a semiconductor device.

A conveying system conveys a substrate to a coating apparatus. The coating apparatus coats the substrate with a resist according to recipe information (S41). The conveying system conveys the substrate coated with the resist from the coating apparatus to the exposure apparatus 201 (see FIG. 11).

In the exposure apparatus 201, the first mask MK-1 fabricated in S30 is set on a mask stage 216, and the first mask MK-1 is aligned with a substrate 207 while controlling the mask stage 216 and a substrate stage 217 (S42). Further, the fabricating of the first mask MK-1 by the method illustrated in FIG. 2 is preferably performed before or on a timing at which S42 starts.

The exposure apparatus 201 performs a first exposure process on a resist 208 on the substrate 207 using the first mask MK-1 (S43). As a result, a latent image according to the first mask MK-1 is formed on the resist 208. The fabricating of the second mask MK-2 by the method illustrated in FIG. 2 is preferably performed before or on a timing at which S43 starts.

The exposure apparatus 201 performs a second exposure process on the resist 208 on the substrate 207 using the second mask MK-2 (S44). As a result, a latent image according to the second mask MK-2 is formed on the resist 208.

After the multiple exposure process (S43 and S44) is completed, the conveying system conveys the exposed substrate from the exposure apparatus 201 to a thermal treatment apparatus. The thermal treatment apparatus performs thermal treatment (baking after the exposure) on the substrate. The conveying system conveys the substrate from the thermal treatment apparatus to a developing apparatus. The developing apparatus develops the latent image formed on the substrate using a certain developer (S45).

The conveying system conveys the developed substrate from the developing apparatus to an inspecting device. The inspecting device inspects the result of the developed resist pattern on the developed substrate (S46), and performs an alignment inspection (S47).

When there is no problem as a result of inspection, the conveying system conveys the substrate to a processing apparatus (e.g. an etching apparatus), and processes the substrate in which the resist pattern is masked (S48). When the processing is completed, the conveying system conveys the substrate from the processing apparatus to the inspecting device. The inspecting device inspects a result of the processed pattern in the substrate (S49). When there is no problem, the process ends.

As described above, in the embodiment, for the multiple exposure, the first mark pattern MP1 on the first mask MK-1 and the second mark pattern MP2 on the second mask MK-2 are formed as patterns corresponding to the mutually inverted patterns. Thus, since it is possible to form the latent image less than the slice level on the resist by performing the first exposure using the first mask MK-1 and performing the second exposure using the second mask MK-2, it is possible to prevent the mark pattern from being transferred onto the substrate while forming the mark pattern on the mask surface at a position close to the device pattern with the dimension equal to or larger than the resolution limit. As a result, since it is possible to reduce the distance from the mark pattern to the device pattern and prevent the mark pattern from being peeled off from the mask surface (the surface of the glass substrate), it is possible to improve the overlay accuracy between a plurality of masks in the mask set while suppressing the defective mask.

Further, in each of the first mask MK-1 and the second mask MK-2, since the mark pattern can be arranged in the device region DR as well as in the kerf region KR, it is possible to easily increase the number of mark patterns arranged in the shot region SH. Thus, even from this point of view, it is possible to improve the overlay accuracy between a plurality of masks in the mask set.

Further, in the embodiment, a plurality of first mark patterns MP1 are arranged on the mask surface of the first mask MK-1 at equal intervals. A plurality of second mark patterns MP2 are arranged on the mask surface of the second mask MK-2 at equal intervals. Thus, when the forming position of the first device pattern DP1 is inspected, it is possible to easily inspect the distribution in the mask surface of the first device pattern DP1 using the first mark pattern MP1. Similarly, when the forming position of the second device pattern DP2 is inspected, it is possible to easily inspect the distribution in the mask surface of the second device pattern DP2 using the second mark pattern MP2. As a result, it is possible to easily narrow down a place to be revised when the forming position of the device pattern is inappropriate.

Further, in the embodiment, the mask set including the first mask MK-1 and the second mask MK-2 is fabricated such that the light shielding portion of the second mark pattern MP2 has a dimension smaller than the light transmitting portion of the first mark pattern MP1, and the light transmitting portion of the second mark pattern MP2 has a dimension larger than the light shielding portion of the first mark pattern MP1. As a result, since it is possible to make uniform the exposure amount of the resist after the multiple exposure, and it is possible to make uniform the film thickness of the resist after the development, it is possible to prevent the film thickness of the resist from affecting processing of the substrate after the development.

Figure 8A:
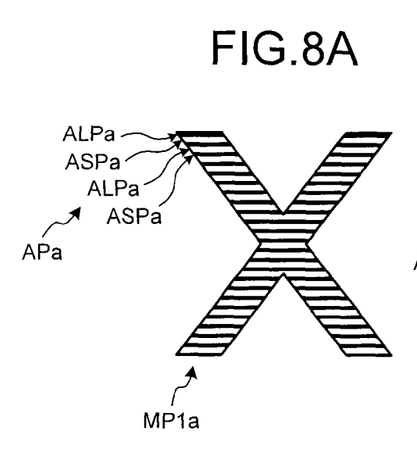
FIGS. 8A and 8B are plane views illustrating a configuration of a mark pattern according to a modified example of an embodiment.
Figure 8B:
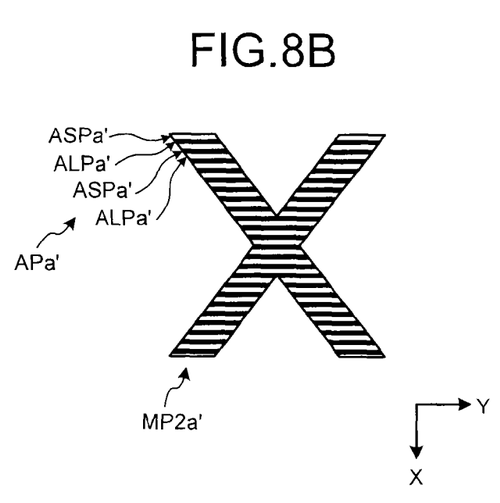
Figure 9A:
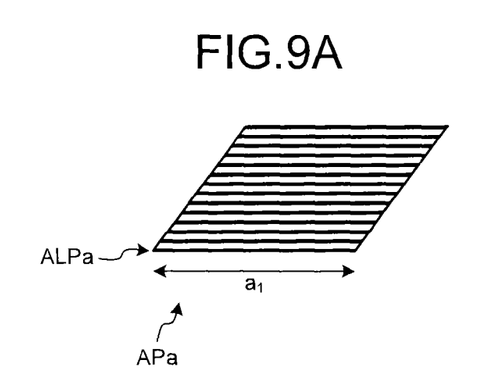
FIGS. 9A and 9B are enlarged plane views illustrating configurations of mark patterns according to an embodiment and a modified example of an embodiment.
Figure 9B:
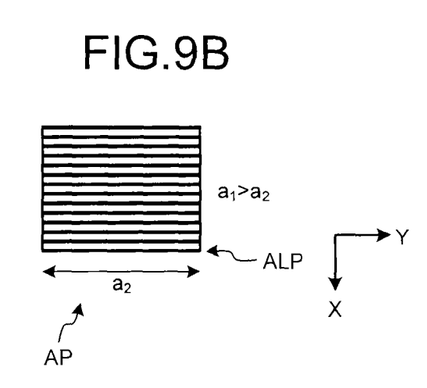

It should be noted that the outer contour of the first mark pattern MP1$a$ and the outer contour of the second mark pattern MP2$a$ may have substantially a letter X shape instead of substantially the cross shape (see FIGS. 4A and 4B) as illustrated in FIGS. 8A and 8B. FIG. 8A is a plane view illustrating a configuration of a first mark pattern MP1$a$. FIG. 8B is a plane view illustrating a configuration of a second mark pattern MP2$a$. For example, the outer contour of the first mark pattern MP1 and the outer contour of the second mark pattern MP2 have substantially a letter X shape obliquely extending in the X direction and the Y direction. In this case, resolvable auxiliary patterns APa and APa' are arranged in the outer contours of the first mark pattern MP1$a$ and the second mark pattern MP2$a$, respectively. In the resolvable auxiliary pattern APa, as illustrated in FIGS. 8A and 8B, line patterns ALPa and ALPa' and space patterns ASPa and ASPa' extending in the Y direction are arranged alternately and repeatedly. In the resolvable auxiliary pattern APa', as illustrated in FIG. 8B, the line pattern ALPa' and the space pattern ASPa' are arranged alternately and repeatedly. As a result, since it is possible to easily cause a length a1 of the line pattern ALPa in resolvable auxiliary pattern APa to be larger than a length a2 of the line pattern ALP in the resolvable auxiliary pattern AP in the above embodiment as illustrated in FIG. 9A, the mark pattern can be further prevented from being peeled off from the mask surface (the surface of the glass substrate). FIG. 9A is an enlarged plane view illustrating a configuration of the first mark pattern MP1a. FIG. 9B is an enlarged plane view illustrating a configuration of the first mark pattern MP1.

The point that the resolvable auxiliary pattern APa' is a pattern obtained by interchanging the line pattern with the space pattern in the resolvable auxiliary pattern AP and, in the obtained pattern, getting the line pattern thinner and the space pattern thicker, as illustrated in FIG. 8B is similar to that in the above embodiment. Therefore, in this mask set, it is possible to make uniform the exposure amount of the resist after the multiple exposure, and it is possible to make uniform the film thickness of the resist after the development, and thus it is possible to prevent the film thickness of the resist from affecting processing of the substrate after the development.

Figure 10A:
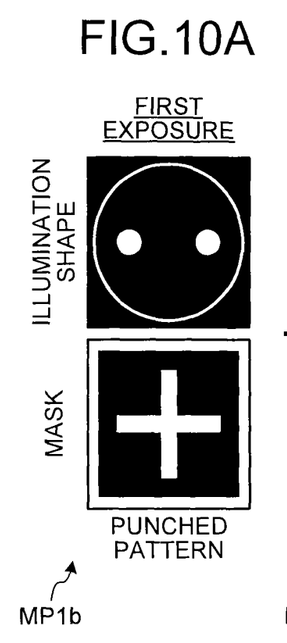
FIGS. 10A to 10C are plane views illustrating a configuration of a mark pattern according to another modified example of an embodiment.
Figure 10B:
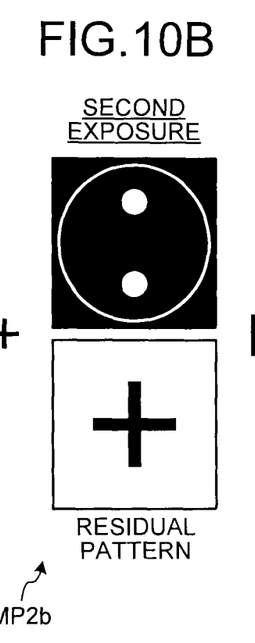
Figure 10C:
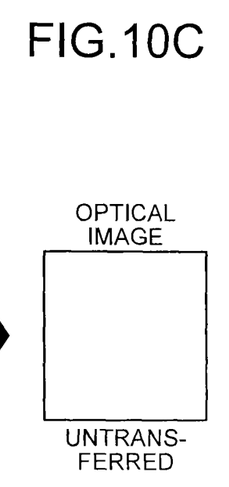

Alternatively, the first mark pattern MP1b and the second mark pattern MP2b may be patterns that are not included in the resolvable auxiliary pattern as illustrated in FIG. 10A and FIG. 10B. For example, the first mark pattern MP1b is a punched pattern. The second mark pattern MP2b is a residual pattern included in a pattern obtained by inverting the punched pattern (the first mark pattern MP1b) at a plane view. In this mask set, it is possible to make uniform the exposure amount of the resist after the multiple exposure, and it is possible to make uniform the film thickness of the resist after the development, and thus it is possible to prevent the film thickness of the resist from affecting processing of the substrate after the development.

Alternatively, the first mark pattern MP1b and the second mark pattern MP2b illustrated in FIGS. 10A and 10B may be interchanged. In other words, the first mark pattern is a residual pattern (see FIG. 10B). The second mark pattern is a punched pattern including a pattern obtained by inverting the residual pattern (the first mark pattern) thereinside at a plane view (see FIG. 10A). In this mask set, it is possible to make uniform the exposure amount of the resist after the multiple exposure, and it is possible to make uniform the film thickness of the resist after the development, and thus it is possible to prevent the film thickness of the resist from affecting processing of the substrate after the development.

Next, a configuration of the exposure apparatus 201 that performs the exposure process using the masks (the first mask MK-1, the second mask MK-2) fabricated as described above will be described with reference to FIG. 11. FIG. 11 is a diagram illustrating a configuration of the exposure apparatus 201.

The exposure apparatus 201 includes an exposure apparatus body 202 and a control device 205. The control device 205 includes an input unit 252, a main control unit 253, a storage unit 251, and a drive control unit 250. The main control unit 253 receives an exposure parameter (for example, an exposure amount, a focus value, and the like) input through the input unit 252, and causes the received exposure parameter to be stored in the storage unit 251 as exposure parameter information 254. The main control unit 253 controls the respective units of the exposure apparatus body 202 through the drive control unit 250 based on the exposure parameter information 254.

The exposure apparatus body 202 includes a light source 210, an aperture diaphragm 211, a filter 212, a polarizing filter 213, the illumination optical system 214, the projection optical system 215, the mask stage 216, and the substrate stage 217. The mask stage 216 holds the mask MK. The substrate stage 217 holds the substrate 207.

For example, the aperture diaphragm 211 has substantially a circular disk shape, and includes a light-emitting region (an illumination region) and a non-light-emitting region (an illumination shielding region). The non-light-emitting region is a region that shields exposure light 210a emitted from the light source 210, and the light-emitting region is a region that transmits the exposure light 210a emitted from the light source 210. In other words, the aperture diaphragm 211 adjusts the lighting shape. Thus, the mask MK is irradiated with illumination light through the illumination optical system 214, and a latent image is formed on a photosensitive material (for example, a resist) 208 on the substrate 207 through the projection optical system 215.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask set, comprising:
a first mask including a first device pattern and a first mark pattern, the first mark pattern being used for an inspection of a position of the first device pattern on a surface of the first mask, an outer contour of the first mask pattern defining a first continuous region; and
a second mask that is used to perform multiple exposure on a substrate together with the first mask, and includes a second device pattern and a second mark pattern, the second mark pattern being used for an inspection of a position of the second device pattern on a surface of the second mask, an outer contour of the second mark pattern defining a second continuous region equivalent to the first continuous region, the second mark pattern being obtained substantially by inverting a light shielding portion and a light transmitting portion of the first mark pattern within the first continuous region.

2. The mask set according to claim 1, wherein
the first mask includes a plurality of first device patterns, the first mark pattern is arranged between the plurality of first device patterns,
the second mask includes a plurality of second device patterns, and
the second mark pattern is arranged between the plurality of second device patterns.

3. The mask set according to claim 1, wherein
the first mask further includes a first kerf region surrounding the first device pattern,
the first mark pattern is arranged more inwardly than the first kerf region,
the second mask further includes a second kerf region surrounding the second device pattern, and
the second mark pattern is arranged more inwardly than the second kerf region.

4. The mask set according to claim 1, wherein
the first mask includes a plurality of first mark patterns,
the plurality of first mark patterns are arranged on the surface of the first mask at certain intervals,
the second mask includes a plurality of second mark patterns, the plurality of second mark patterns are arranged on the surface of the second mask at certain intervals.

5. The mask set according to claim 1, wherein
the first mark pattern includes an auxiliary pattern having a dimension equal to or larger than a resolution limit or higher, and
the second mark pattern includes an auxiliary pattern having a dimension equal to or larger than the resolution limit.

6. The mask set according to claim 1, wherein
the light shielding portion of the second mark pattern has a dimension smaller than the light transmitting portion of the first mark pattern.

7. The mask set according to claim 6, wherein
a light transmitting portion of the second mark pattern has a dimension larger than the light shielding portion of the first mark pattern.

8. The mask set according to claim 1, wherein
each of the first mark pattern and the second mark pattern includes line patterns and space patterns that are alternately repeated within the outer contour, and
a width of the line pattern in the second mark pattern is smaller than a width of the space pattern in the first mark pattern.

9. The mask set according to claim 8, wherein
a width of the space pattern in the second mark pattern is larger than a width of the line pattern in the first mark pattern.

10. The mask set according to claim 8, wherein
the outer contour of the first mark pattern is equivalent to the outer contour of the second mark pattern.

11. The mask set according to claim 10, wherein
each of the outer contour of the first mark pattern and the outer contour of the second mark pattern has substantially a cross shape.

12. The mask set according to claim 10, wherein
each of the outer contour of the first mark pattern and the outer contour of the second mark pattern has substantially a letter X shape.

13. The mask set according to claim 1, wherein
the first mark pattern is a punched pattern, and
the second mark pattern is a residual pattern included inside a pattern obtained by inverting the punched pattern at a plane view.

14. The mask set according to claim 1,
wherein the first mark pattern is a residual pattern, and
the second mark pattern is a punched pattern including therein a pattern obtained by inverting the residual pattern at a plane view.

15. A fabrication method of a mask set, comprising:
generating data of a first mask by arranging a first device pattern and a first mark pattern, the first mark pattern being used for an inspection of a position of the first device pattern on a surface of the first mask, an outer contour of the first mask pattern defining a first continuous region; and
generating data of a second mask by arranging a second device pattern and a second mark pattern, the second mark pattern being used for an inspection of a position of the second device pattern on a surface of the second mask, an outer contour of the second mark pattern defining a second continuous region equivalent to the first continuous region, the second mark pattern being obtained substantially by inverting a light shielding portion and a light transmitting portion of the first mark pattern within the first continuous region, the second mask being used to perform multiple exposure on a substrate together with the first mask.

16. The fabrication method of the mask set according to claim 15, further comprising,
verifying that the first mark pattern and the second mark pattern are not to be transferred onto the substrate by the multiple exposure, using the data of the first mask and the data of the second mask.

17. The fabrication method of the mask set according to claim 15, further comprising:
generating the first mask using the data of the first mask;
generating the second mask using the data of the second mask;
inspecting the position of the first device pattern on the surface of the generated first mask using the first mark pattern; and
inspecting the position of the second device pattern on the surface of the generated second mask using the second mark pattern.

18. A manufacturing method of a semiconductor device, comprising:
manufacturing a mask set including a first mask and a second mask by the fabrication method according to claim 15;
performing first exposure on a substrate using the first mask; and
performing second exposure on the substrate using the second mask.

19. The manufacturing method of the semiconductor device according to claim 18, further comprising
developing the substrate that has been subjected to the multiple exposure including the first exposure and the second exposure.

20. A nontransitory computer readable recording medium including a program recorded therein, the program causing a computer to execute:
generating data of a first mask by arranging a first device pattern and a first mark pattern, the first mark pattern being used for an inspection of a position of the first device pattern on a mask surface, an outer contour of the first mask pattern defining a first continuous region; and
generating data of a second mask by arranging a second device pattern and a second mark pattern, the second mark pattern being used for an inspection of a position of the second device pattern on a surface of the second mask, an outer contour of the second mark pattern defining a second continuous region equivalent to the first continuous region, the second mark pattern being obtained substantially by inverting a light shielding portion and a light transmitting portion of the first mark pattern within the first continuous region, the second mask being used to perform multiple exposure on a substrate together with the first mask.

* * * * *